United States Patent [19]

Keizer et al.

[11] 4,166,562
[45] Sep. 4, 1979

[54] ASSEMBLY SYSTEM FOR MICROCOMPONENT DEVICES SUCH AS SEMICONDUCTOR DEVICES

[75] Inventors: Alan S. Keizer, Huntingdon Valley; Donald B. Brown, Willow Grove, both of Pa.

[73] Assignee: The Jade Corporation, Huntingdon Valley, Pa.

[21] Appl. No.: 829,837

[22] Filed: Sep. 1, 1977

[51] Int. Cl.² .................................. H01L 21/98
[52] U.S. Cl. .......................... 228/5.1; 228/6 A; 228/13; 228/15.1; 29/741
[58] Field of Search ............. 29/741, 591; 228/5.1, 228/5.5, 6 A, 13, 15.1, 170, 180 A

[56] References Cited
U.S. PATENT DOCUMENTS

| 3,442,432 | 5/1969 | Santangini | 228/6 A X |
| 3,465,408 | 9/1969 | Clark et al. | 228/6 A X |
| 3,593,404 | 7/1971 | Ragard | 29/741 X |
| 3,689,991 | 9/1972 | Aird | 29/589 X |
| 3,724,068 | 4/1973 | Galli | 228/6A X |
| 3,859,718 | 1/1975 | Noe | 29/591 |
| 3,887,783 | 6/1975 | Comette | 228/6A X |
| 3,911,568 | 10/1975 | Hartlerroad et al. | 228/4.1 X |
| 3,949,925 | 4/1976 | Keizer et al. | 228/6 A X |
| 4,003,125 | 1/1977 | Wallick | 29/591 X |
| 4,010,885 | 3/1977 | Keizer et al. | 228/6 A |

OTHER PUBLICATIONS

Grossman, "Film-Carrier Technique . . ." *Electronics*, May 16, 1974.

Primary Examiner—C. W. Lanham
Assistant Examiner—K. J. Ramsey
Attorney, Agent, or Firm—Seidel, Gonda, Goldhammer & Panitch

[57] ABSTRACT

An assembly system for assembling microcomponents of semi-conductor or other electronic devices includes on a unitary machine frame the tooling for precision excising tape mounted microcomponents, precision forming their electrical leads, placement of the components in correct registration with conductors on a pre-positioned substrate, and bonding the formed leads to the conductors.

26 Claims, 42 Drawing Figures

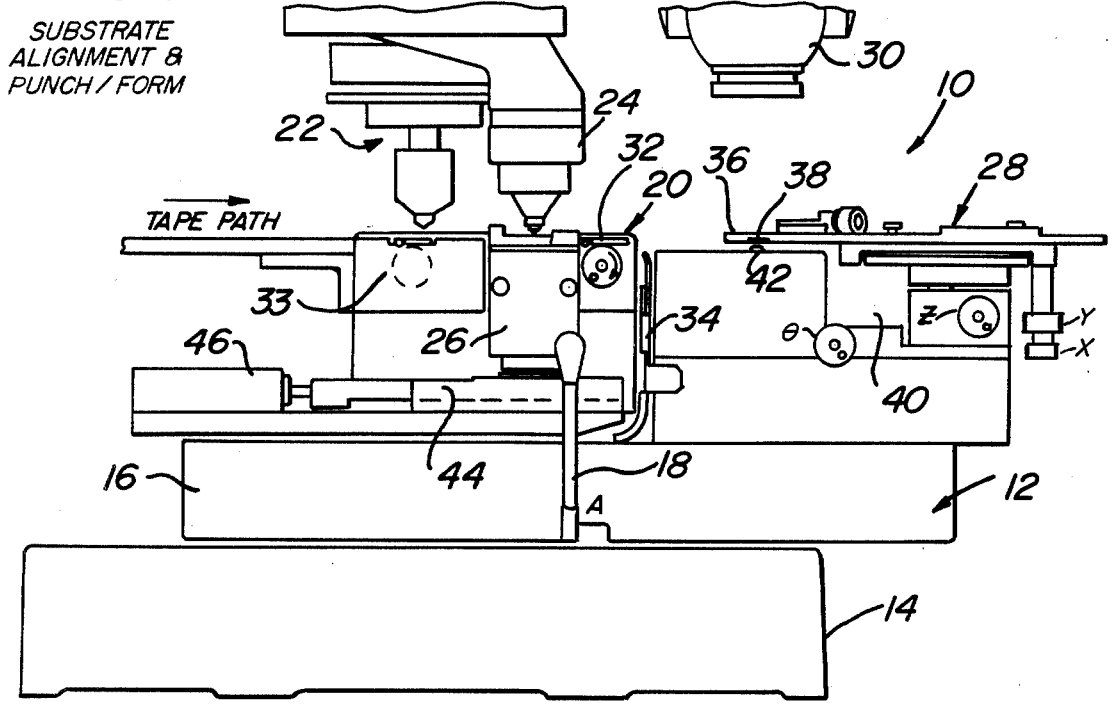
FIG. 1 SUBSTRATE ALIGNMENT & PUNCH/FORM
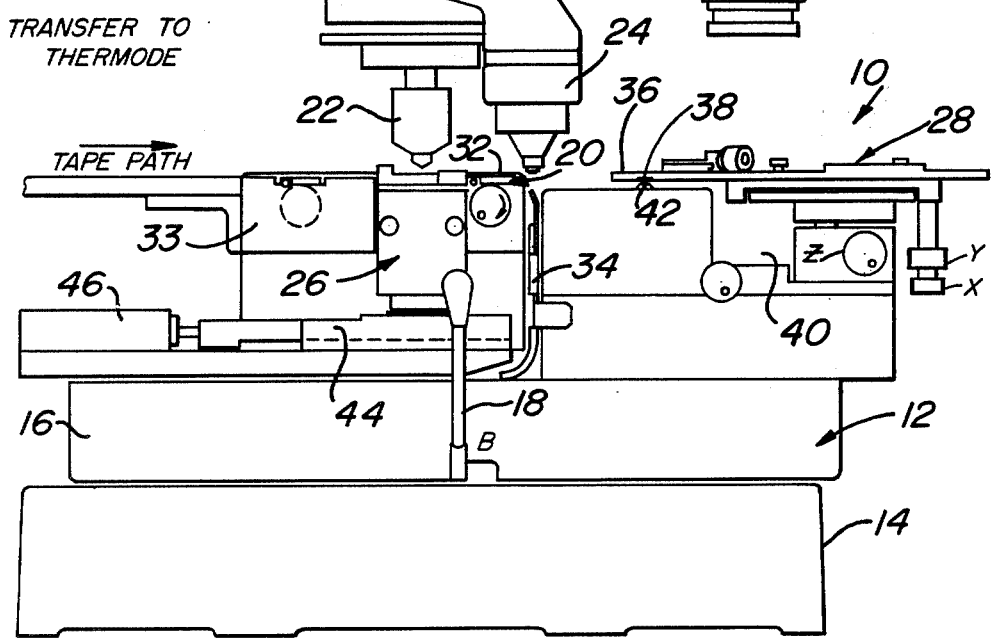
FIG. 2 TRANSFER TO THERMODE

TRANSFER TO SUBSTRATE

BOND

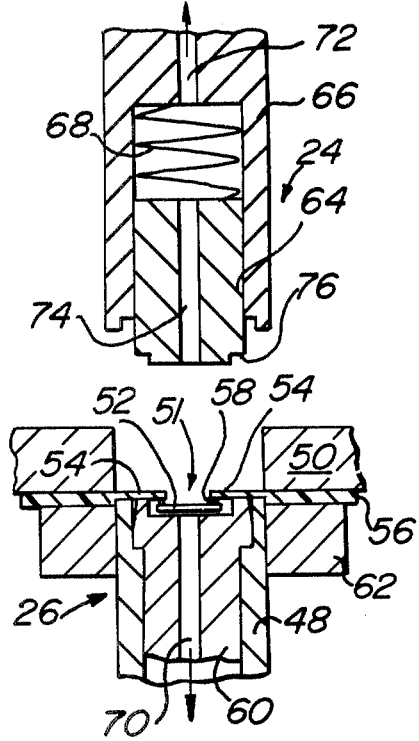
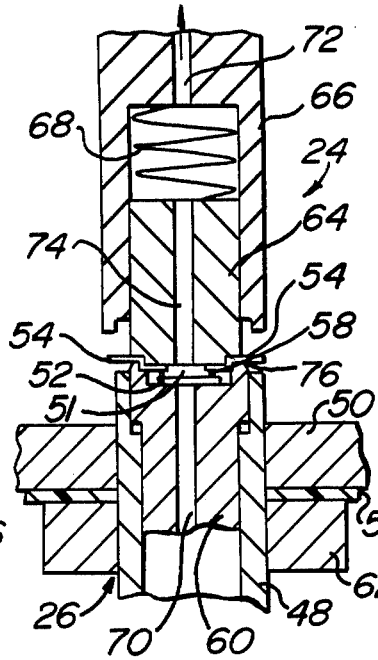
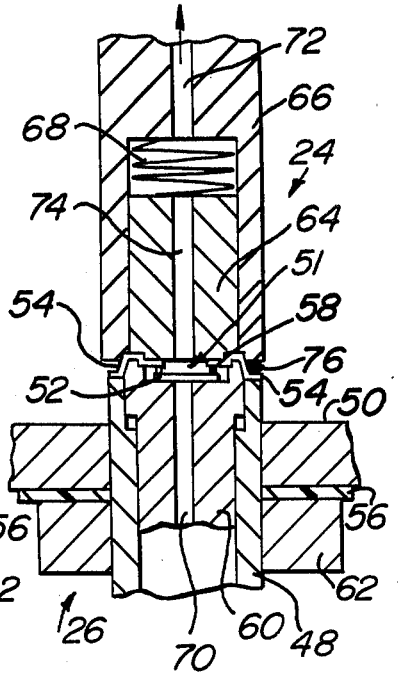
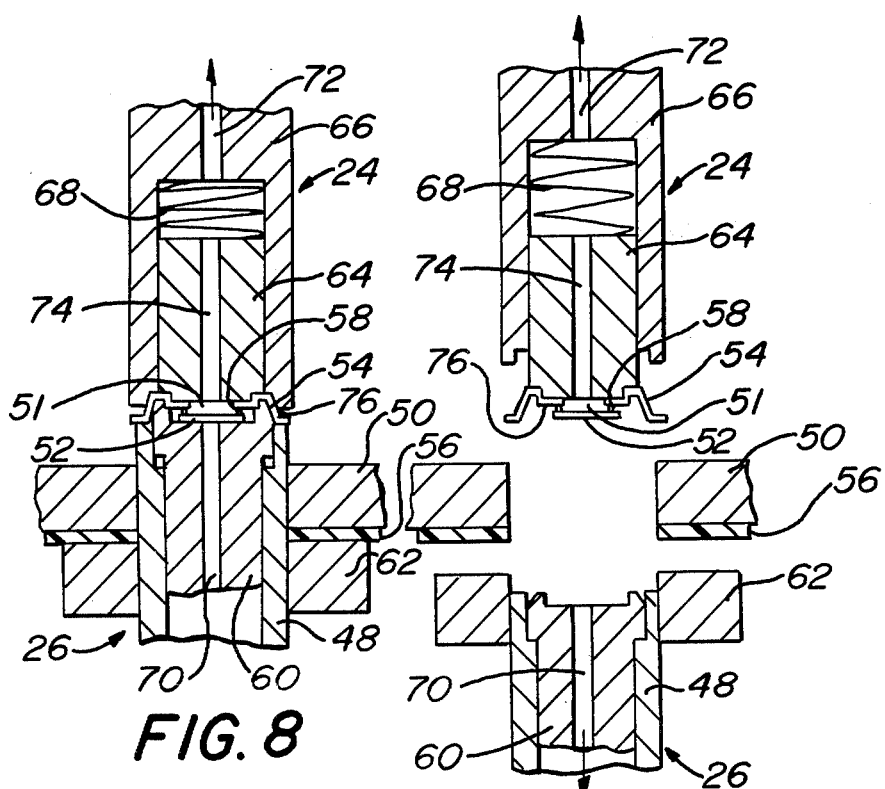
FIG. 5  FIG. 6  FIG. 7  FIG. 8  FIG. 9

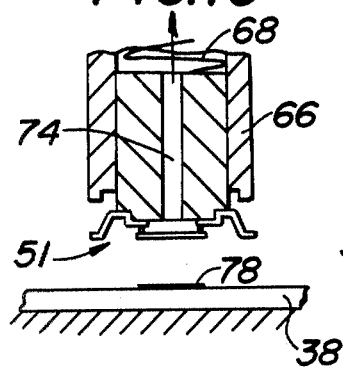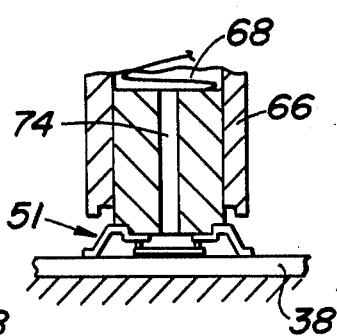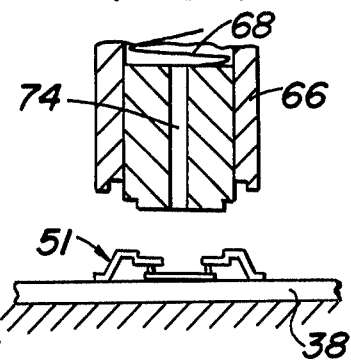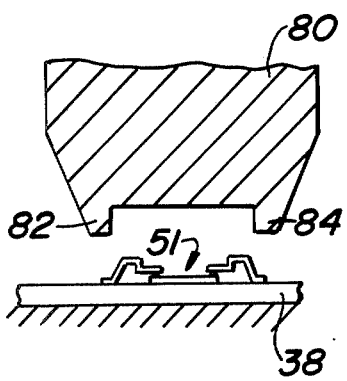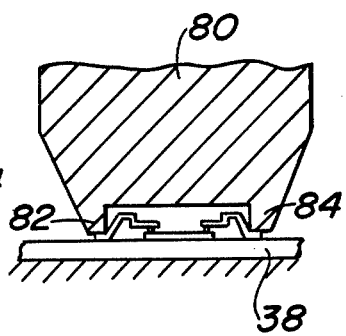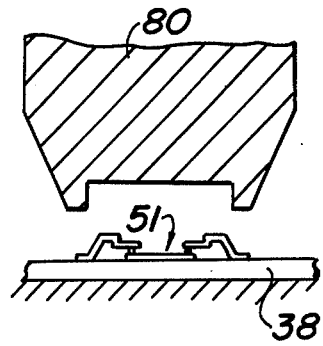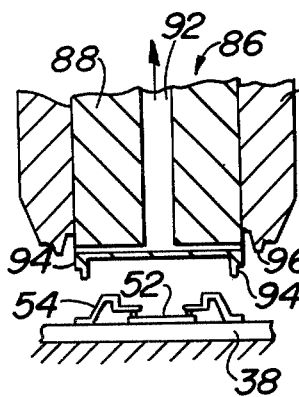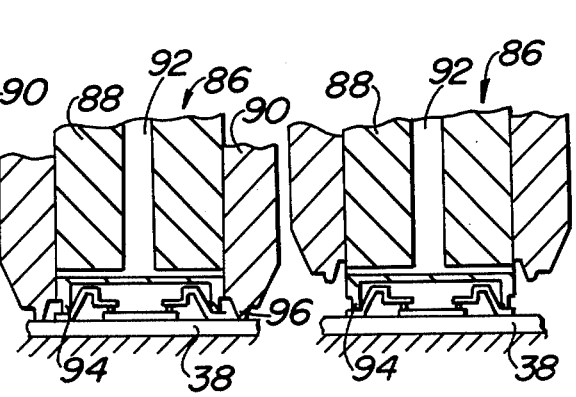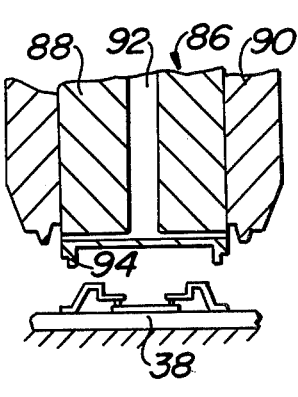

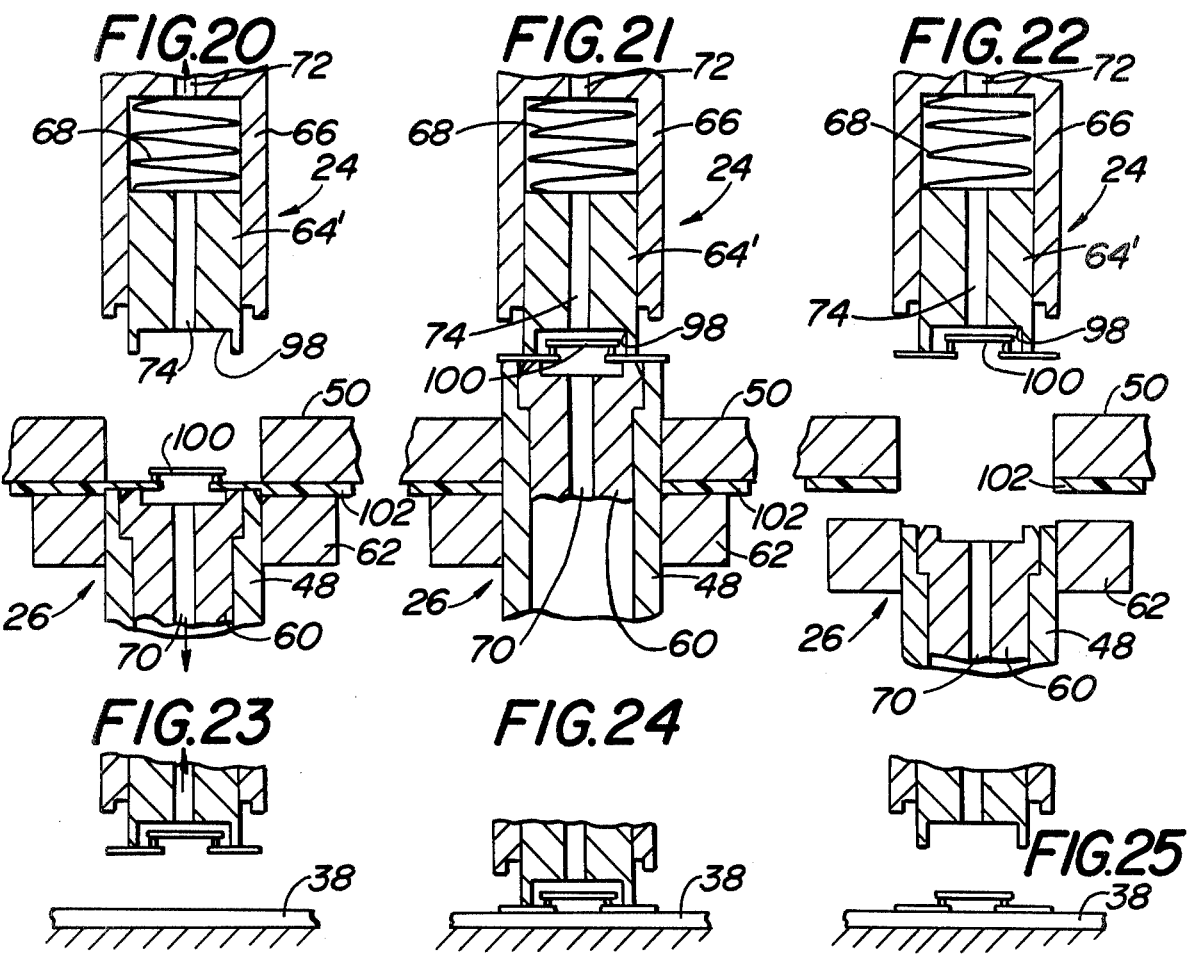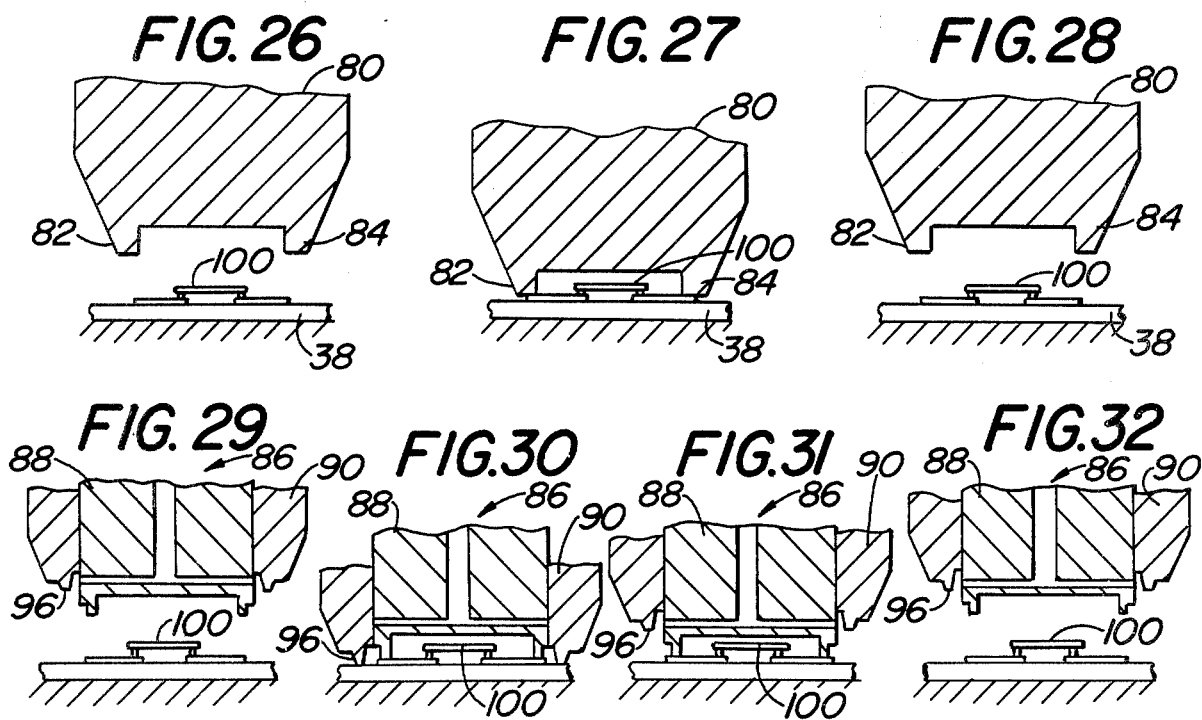

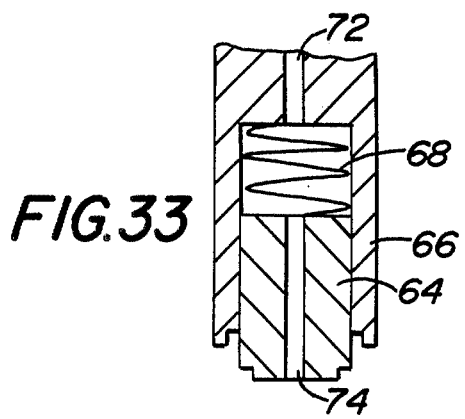
FIG.33
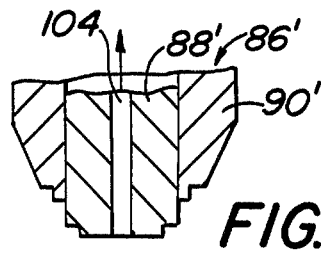
FIG.34
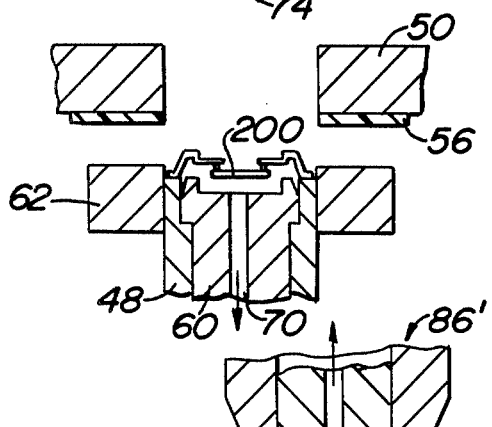
FIG.35
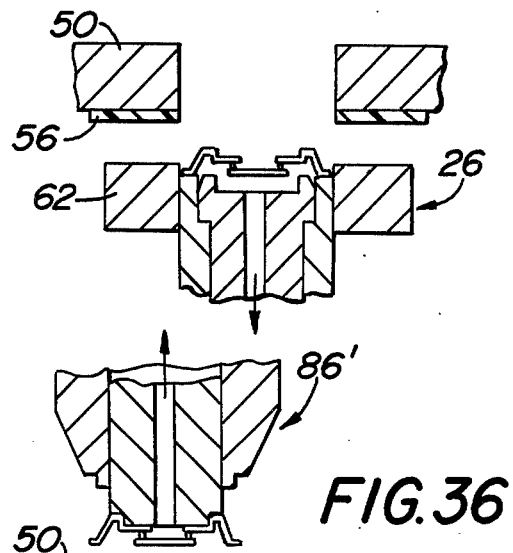
FIG.36
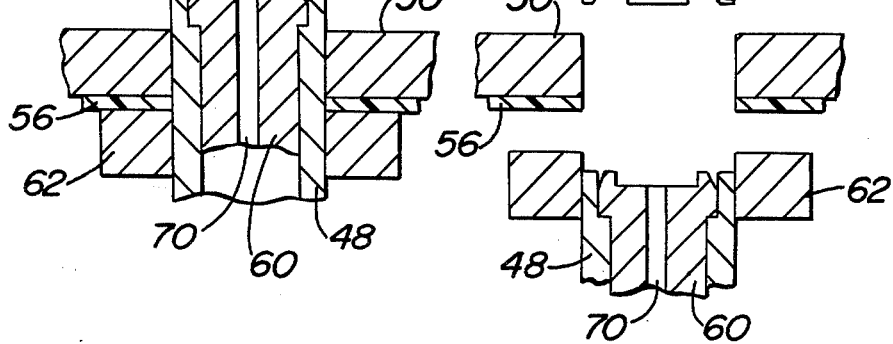
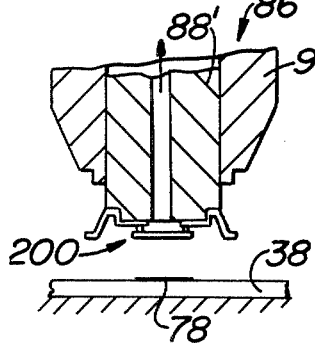
FIG.37
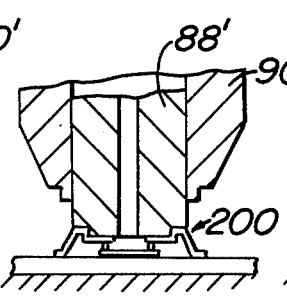
FIG.38 FIG.39
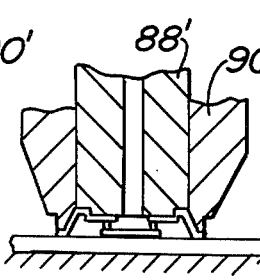
FIG.40

ASSEMBLY SYSTEM FOR MICROCOMPONENT DEVICES SUCH AS SEMICONDUCTOR DEVICES

This invention relates to an assembly system. More particularly, this invention relates to an assembly system for elements of microcomponent devices such as integrated circuit and other electronic devices.

There is a continuing need to automate the assembly of microcomponent devices such as integrated circuit devices so as to increase productivity by reducing cost and increasing assembly rates. For this reason, a number of techniques have been developed to replace lead-by-lead wire-bonding which was one of the most commonly used methods of making connections to integrated circuit chips. One such technique is the film carrier wherein an interconnect pattern is bonded to a flexible film strip having an aperture into which the metal pattern terminals extend. The terminals are arranged within the aperture to coincide with the contact points on the semiconductor chip, and thereby permit simultaneous bonding of all interconnect terminals to the chip in a single step. Thus, one major advantage of the film carrier technique is that it makes possible gang-bonding which is an obvious improvement over the sequential wire bonding technique. See *Electronics*, May 16, 1974 and U.S. Pat. Nos. 4,010,885 and 3,689,991. Another advantage of the film carrier technique is that the film with the chips bonded or otherwise mounted thereon can be used for further processing. See, for example, U.S. Pat. No. 3,949,925 which describes an apparatus for automatically and accurately bonding film carrier interconnects to lead frames with the semi-conductor device already bonded to the inner leads.

Apparatus such as the outer lead bonder described in U.S. Pat. No. 3,949,925 are limited to a single principal function such as bonding the inner leads to the outer leads in a lead frame for single chip packaging. However, more recent developments in integrated circuit technology require the assembly of varying types of chip packages. Multiple chips are now bonded to a substrate having a prefabricated interconnect pattern formed thereon. This is sometimes referred to as a multi-chip package. These new types of packages, whether single chip or multi-chip, may require that the inner leads be formed to a particular shape suitable for bonding. For example, if the chip is to be positioned on a substrate with the bonding pads facing away from the substrate surface (face up), then the leads must be formed to the correct shape for making contact with the interconnect pattern on the substrate. The leads must be shaped so as not to make contact with the die and thus result in an electrical short circuit. This is a delicate process as the bond between the leads and the die cannot withstand excess forces. Some packages do not require shaping of integrated circuit leads such as where the chip is positioned on the substrate with the bonding pads facing down (face down) or the chip is positioned face up in a channel in the substrate.

Thus, in general present day packaging techniques for microcomponent devices such as integrated circuits or semi-conductor devices may require shaping or forming of the electrical leads extending from the device, apparatus for transferring the device and its leads (whether formed or not) to a position in correct registration with the conductors on a substrate, and apparatus for bonding the leads to the substrate conductors. If film carrier techniques are used, then apparatus is required for removing the device and its leads from the film carrier prior to forming the leads.

The present invention provides an assembly system for accomplishing the foregoing in either a semi-automatic or automatic mode. More particularly, the present invention provides a system for assembling elements of microcomponent devices such as integrated circuit semi-conductor devices in a semi-automatic or automatic mode while precisely accomplishing the diverse assembly procedures described above. The assembly apparatus and process of the present invention provides, on a unitary machine frame, the tooling for excising a tape mounted component, forming the leads, if required, placing the component and its leads in registration with the conductors on a substrate, and bonding the leads to the conductors. The foregoing procedures are performed in a step-by-step fashion without the need to adjust the spatial relationships between the components and the work tools prior to each assembly operation. In other words, there is no need to realign the leads with the forming tool or with the substrate as the device is being assembled.

Another advantage of the present invention is that the assembly process and apparatus are not limited to a single ultimate function. The assembly system can be used where forming is to be omitted such as where the chip is bonded face down to the substrate or is positioned face up in a channel. Different methods and apparatus can be used to transfer the component to the substrate. Moreover, the system can accommodate different bonding techniques including thermocompression, local reflow or mass reflow.

Although the present is described in the environment of assembling integrated circuit devices, which is its principal purpose, it should be understood that the inventions described and claimed herein are not limited to use with integrated circuit semi-conductor devices and would be equally useful for the assembly of other microcomponent devices such as passive electronic devices.

In accordance with the present invention there is provided an assembly system for use in the assembly of microcomponent devices wherein there is mounted on a unitary machine frame, an excising means for removing from the tape an element (e.g., chip or passive electrical element) and the metal elements (e.g., electrical leads) which are bonded to it, a forming tool for forming the metal elements to a shape suitable for use in further assembly, transfer means for transferring the component and its metal elements to a substrate and depositing it on the substrate in registration with the elements to which the metal elements are to be bonded, and bonding means for bonding the metal elements to the substrate elements. All of the foregoing assembly steps are accomplished without the need for realigning the components with the work tools at each step of the operation.

The assembly system apparatus precisely locates, excises and forms the leads of a tape mounted microcomponent device. Excising and forming are done by compound tools. The apparatus system includes a compound punch, die and forming anvil working in cooperation with an opposed forming and transfer tool. The excising of the device is accomplished using a precision punch with a spring loaded pressure pad. After forming, the device and its formed leads are transferred to the substrate either by the forming-transfer tool or alternatively by the use of a part of the bonding tool.

Another advantage of the present invention is that it provides a novel method for mechanical pulse reflow bonding. Thermocompression and pulse reflow are known bonding procedures used to join metallic elements such as the electrical leads for semi-conductor devices. Thermocompression bonding uses a combination of heat and pressure to effect the bond. In general, reflow bonding involves the use of heat and pressure wherein metal, such as a eutectic, is melted at the bond site and then solidifies to form the bond. Reflow bonding requires that a pulse of heat be applied to the bond site, and it is sometimes useful to pulse heat when thermocompression bonding. Various electronic means have been developed for controlling the heat pulse applied to the bond site. In general, these electrical devices control the temperature profile (temperature (T.) v. time (t.)) of the thermode which applies both heat and pressure to the bond site. Considering the complexity of the metallurgy, the small size of the elements being bonded, the need for high rates of operation, as well as reliability, it is not surprising that the electonics for controlling pulse heated thermodes is complex and expensive.

The mechanical pulse reflow bonding apparatus and process of the present invention replaces the complex electronics with a mechanical method of effecting the appropriate temperature profile at the bond site. In accordance with the present invention, a thermode for making the bond includes both a cold tip and a steady state heated anvil. The cold tip clamps the metal elements to be bonded. The heated anvil is laterally spaced from the cold tip and makes contact with a heat conductive path to the bonding site either simultaneously with or after the cold tip clamps the elements together. Heat then flows into the bonding site for a predetermined amount of time necessary to effect the bond, and then the heated anvil is withdrawn to terminate the heat flow. Thus, a heat pulse is applied to the bond site. The cold tip clamp remains in the clamping position until the reflow bond has solidified. Thereafter, the cold tip clamp is retracted.

The advantage of the foregoing apparatus and process for effecting pulse reflow bonding is that the heated anvil can be maintained at a constant temperature with the temperature profile at the bond site being controlled by the amount of time that the heated anvil is in contact with the heat conductive path. This is much less complex than electronically raising and then lowering the thermode temperature. Since the cold tip clamps the elements together until the reflow bond has solidified, a more relieable bond is made.

Accordingly, the present invention relates to a process and apparatus for effecting mechanical pulse reflow bonding.

For the purpose of illustrating the invention, there are shown in the drawings forms which are presently preferred; it being understood, however, that this invention is not limited to the precise arrangements and instrumentalities shown.

FIG. 1 is a elevational view of the assembly system in its excising and forming mode.

FIG. 2 is an elevational view of the assembly system in an alternative mode for transferring a device and its leads to the bonding position.

FIGS. 5, 6, 7, 8 and 9 illustrate the excising and forming modes of the system.

FIGS. 10, 11 and 12 illustrate the transfer of the devices and its formed leads to a substrate using the forming tool.

FIGS. 13, 14 and 15 illustrate bonding the leads to a substrate by thermocompression or pulse reflow bonding.

FIGS. 16, 17, 18 and 19 illustrate a new method and apparatus for mechanical pulse reflow bonding using a coaxial cold tip thermode.

FIGS. 20, 21, 22, 23, 24 and 25 illustrate the use of the assembly system without a forming step for a semi-conductor device positioned face down.

FIGS. 26, 27, and 28 illustrate bonding a semi-conductor device and its leads to a substrate in the face down position using thermocompression or pulse reflow bonding.

FIGS. 29, 30, 31 and 32 illustrate bonding a semi-conductor device and its leads to a substrate in the face down position using mechanical pulse reflow bonding with a coaxial cold tip thermode.

FIGS. 33, 34, 35, 36, 37, 38, 39 and 40 illustrate an alternative method of carrying a semi-conductor device and its formed leads to the bonding position using a cold tip thermode and thereafter bonding the same to the substrate.

Figures 41, 42:
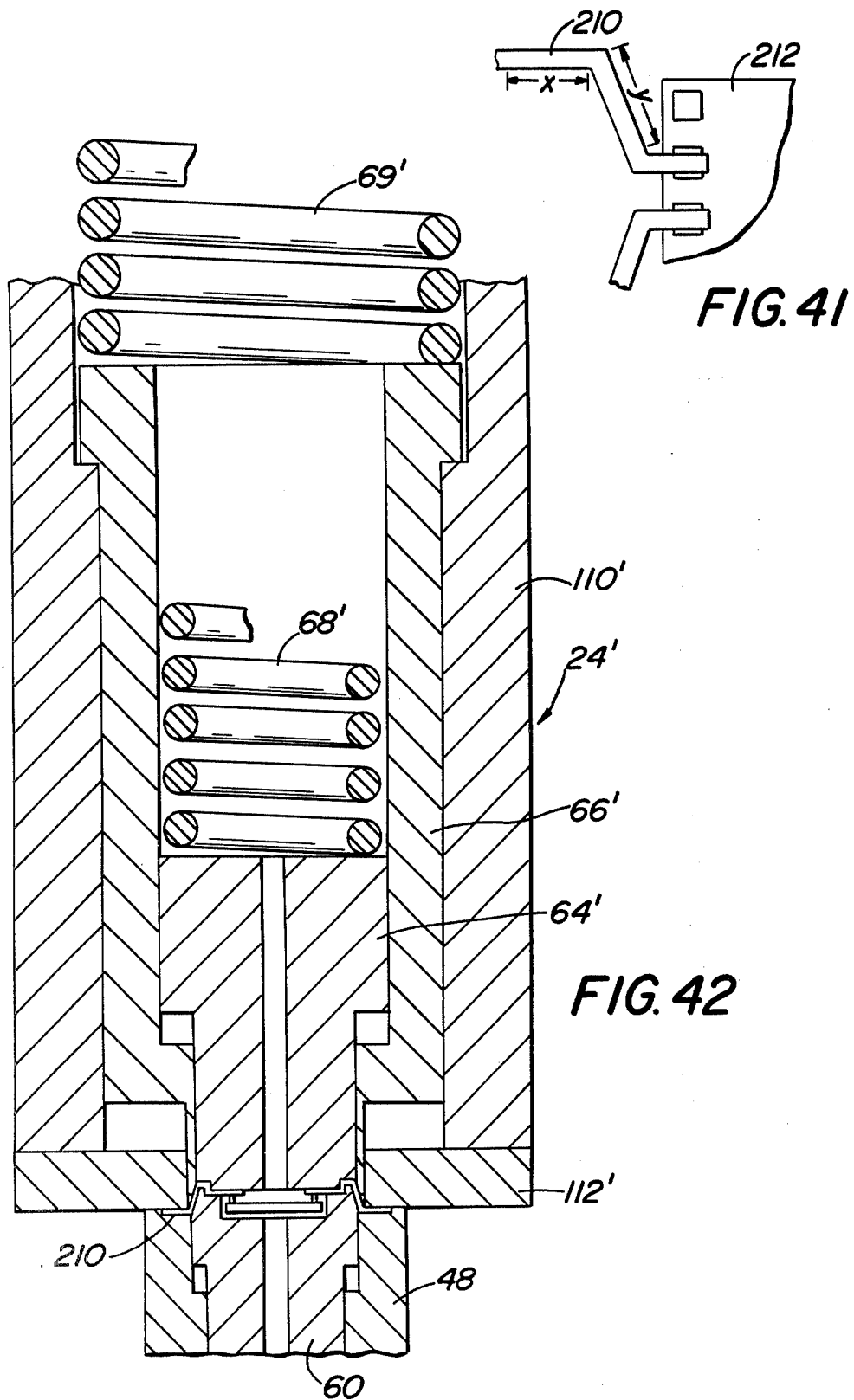

FIGS. 41 and 42 illustrates an alternative forming tool for making lead configurations.

Referring to the drawings in detail, wherein like numerals indicate like elements, there is shown in FIG. 1 an apparatus 10 for use in the assembly of microcomponent devices. The microcomponent assembly apparatus includes a slide assembly 12 which is mounted on the bed 14 by means of precision manufactured slides and cooperating guide grooves. The slide assembly 12 moves from left to right in the plane of the drawings. It is manually controlled by operating the control handle 18 and associated precision location stops (not shown). As disclosed herein, the slide assembly 12 has four precision location stops. Each stop has an absolute precision accuracy of ±0.0003". The slide assembly 12 is shown in position A as indicated in FIG. 1. It is shown in position B in FIG. 2, position C in FIG. 3 and position D in FIG. 4.

The slide assembly 12 and bed 14 provided a unitary machine frame upon which is supported all of the major subassemblies for performing the assembly processes described herein. These subassemblies are mounted on the frame and organized so as to provide complete tooling for excising tape mounted microcomponent devices, forming the leads to a desired shape, transferring the device and its formed leads to a prepositioned substrate, depositing it on the substrate in registration with conductors or other components to which the leads are to be bonded, and a bonding tool for effecting the bonds.

As shown, the slide assembly 12 includes a slide frame 16 upon which is mounted the tape feed assembly 20. The tape path is indicated by the arrow on the left side of the drawing and indicates how the tape is drawn by the indexing mechanisms 32 and 33 through the excising assembly 26 and the film take-up guide 34. The tape feed assembly may include structure as shown in U.S. Pat. Nos. 4,010,885 and 3,949,925 or an equivalent mechanism for sequentially and precisely indexing each tape mounted device into position within the excising assembly 26. In a preferred embodiment, the indexing mechanisms 32 and 33, which include feed elements and detents which engage the tape sprocket holes, are provided at both the entry and exit ends of the excising assembly. This permits control of both the first and last position on the tape.

The tape format can be standard 35 mm, 16 mm, 11 mm or ½ inch. Moreover, the tape can be continuously fed from reel to reel, or it can be tape strips, or even individual slide fixtures for a segment of film strip such as described in U.S. Pat. No. 4,007,479.

A post or open "C" is fixed to the bed 14 and supports the bonder 22. The support for the bonder 22 is designed for the high forces required for thermocompression bonding. The bonder 22 is pneumatically controlled to move the thermodes hereinafter described into and out of contact with the elements to be bonded. Such controls are known and otherwise available, and therefore need not be described in detail.

The substrate support assembly 28 is mounted on the slide frame 16 and provides a substrate handling system for aligning the substrate by means of the microvideo system 30 prior to bonding a device to it. In particular, the substrate support assembly includes a table 36 which clamps the substrate 38 in position beneath the microvideo system. The table 36 is mounted on a manually operated X-Y-θ-Z micro-manipulator 40. By way of example, the micro-manipulator may provide fine adjustable motions of:

$X = 3$ Inches (left to right)
$Y = 2$ Inches (front to back)
$\theta = \pm 5°$

The substrate 38 is clamped in position with a spring loaded universal substrate holder with a typical range of ½ inch × ½ inch to 2 inches × 2 inches.

In most instances, it is desirable to heat the substrate. Otherwise, it functions as a heat sink drawing heat from the bonding site. For this purpose, a heated anvil 42 is provided. The anvil 42 is heated by a closed loop temperature control system with a temperature range from ambient room temperature to 400° C. The manually operated Z (up and down) motion of the micro-manipulator 40 permits the operator to control the amount of time the substrate is in contact with the heated anvil. The area of heated contact is selected in accordance with the particular requirements of the type of substrate and microcomponent device to be bonded.

The microvideo system is a closed circuit television system in combination with a microscope optical system. In a preferred embodiment, the optical system has three preset magnifications. This allows precise repeatability of the magnification and optical axis stability. The closed circuit television fields of view depend upon the lenses selected. Standard fields of views are:

| Field of View Size | X | Y |
|---|---|---|
| minimum | .060 inch | .040 inch |
| intermediate .150 inch | .110 inch | |
| maximum | .370 inch | .240 inch |

If desired, an electronic reticle can be provided on the television monitor. Such closed circuit television microvideo systems are available and therefore need not be described in detail. The microvideo system 30 is also supported by the base 14 using an appropriate post or the like.

As shown, the excising assembly 26, together with the tape feed mechanism 20, is mounted on the slide 12 whose position is adjustable (right to left in FIG. 1). A dual linear cam 44 is actuated by an air cylinder 46. The dual linear cam has a pair of linear camming surfaces which allow separate motion profiling of the punch 48 and inner forming tool 60 in the assembly. See FIGS. 5-9. This permits control of the absolute as well as relative motion of the punch 48 and tool 60 by a single source. This provides for adjustments based upon changes in tape format.

The excising assembly 26 functions in cooperation with the forming and transfer assembly 24 mounted directly above it. The forming and transfer assembly is mounted by a post or other appropriate support on the bed 14. The forming and transfer assembly 24 and excising assembly 26 precisely locate, excise and form the leads of a tape mounted integrated circuit or other device. The manner in which these assemblies operate is described in more detail hereinafter.

All of the foregoing described assemblies are mounted on the same machine frame. Thus, while they perform diverse operations in the assembly of a microcomponent, their spatial relationships are fixed so that the device can be assembled without the necessity for precisely positioning the components at each assembly operation. This should become even more apparent from what is disclosed hereinafter.

The invention will be described with particular reference to an integrated circuit device since that is its principal purpose. However, those skilled in the art will readily recognize that the invention is not limited to use with integrated circuit devices and that it may be used in the assembly and/or bonding of other microcomponents. It should also be noted that the integrated circuit device is referred to as being "tape mounted", it being understood that this includes but is not limited to integrated circuits bonded to film carriers. Moreover, the term "tape" is meant to include continuous tape, tape strips of predetermined length, and individual slides or the like whether or not mounted in a fixture.

To commence the assembly operation, the slide assembly 12 is moved to position A shown in FIG. 1. At that position, the substrate 38 is clamped in position on the table 36. It is thereafter adjusted by means of the micromanipulator 40 and the microvideo system 30 to bring it into position for bonding the leads of the integrated circuit device to a interconnect conductor pattern on the substrate. The substrate itself may be designed to have one or more integrated circuit device bonded to it, depending upon whether it is to be a single or multichip package. The substrate can be ceramic, polimide, glass-epoxy or any of the materials used to make printed circuit boards.

It is assumed that the tape has been properly installed in the assembly apparatus 10 and that the first integrated circuit chip has been indexed into position within the excising assembly 26 by the tape feed assembly 20. As previously explained, it is the nature of such tape mechanisms that further precise alignment is not required. Rather, the position of the tape mounted integrated circuit and its leads are known by reason of the fixed dimensions of the tapes sprocket holes and apertures. However, further additional positioning can be achieved by using the techniques disclosed in U.S. Pat. No. 3,949,925 including the pilot pins.

FIGS. 5, 6, 7, 8 and 9 show details of the forming and transfer assembly 24 and the excising assembly 26. As shown, the excising assembly includes a punch 48 and coaxial die 50. The punch 48 functions to sever the integrated circuit device 51, comprising the chip 52 and its leads 54, from the film strip 56. As shown in FIG. 5, the aperture in film strip 56 is positioned over the opening in die 50 and the leads 54 are bonded to the chip 56 at the bonding pads 58. A male forming tool 60 is seated within the punch 48. A pressure pad 62 clamps the film strip 56 between its upper surface and the face of the die adjacent to its entrance end. The pressure pad 62 is reciprocable relative to the die 50 and is spring loaded for the purpose of clamping the film strip 56 in position. Punch 48 reciprocably moves through the die 50 together with the male forming tool 60.

Punch 48 and die 50 are precision tools, and they function to punch and thereby remove the integrated circuit device from the film strip 56 to which it is mounted. This occurs as the punch 48 moves through the die opening 50 with the male forming tool 60 in one continuous motion. After the punch 48 has excised the chip 52 and its leads 54 from the film strip 56, the male forming tool 60 advances relative to the punch, as shown in FIG. 6, and together with the punch carries the integrated circuit device into position against the surface of the forming clamp 64.

Forming clamp 64 is part of the forming and transfer assembly 24 which is mounted coaxially with the excising assembly 26. Forming clamp 64 is coaxially mounted within female forming tool 66, and it is normally biased to the extended position shown in FIG. 5 by spring 68.

The integrated circuit device 51 is held in position on the forming tool 60 as it is carried in contact with the forming clamp 64 by drawing a vacuum through opening 70. For purposes which are explained hereinafter, the integrated circuit 52 is held on the forming clamp 64 by drawing a vacuum through openings 72 and 74.

The complete excising and forming process can be described in detail by reference to FIGS. 5, 6, 7, 8 and 9. As shown in FIG. 5, the film strip 56 is indexed into position. Thereafter, the pressure pad 62 clamps it against the entrance face of die 50. The next step in the sequence is for the punch 48 to move through the die 50 thereby excising the integrated circuit device 51 from the film strip 56. A vacuum is simultaneously applied to both the male forming tool 60 and the forming clamp 64 as indicated by the arrows. When the leads 54 are clamped between the male forming tool 60 and the forming clamp 64, the vacuum applied to opening 70 is relieved.

The forming clamp 64 may be provided with forming shoulders 76 which cooperate with the shaped tip of the male forming tool to not only clamp the leads 54, but also shape them as shown in FIG. 6. Thus, FIG. 6 shows the integrated circuit device 52 after it has been punched out of a film strip 56, carried up to the forming clamp, clamped, and partially formed. This particular forming step raises a part of the leads so as to provide a relief that prevents them from touching the side of the integrated circuit 52 when they are bent downwardly as illustrated in FIG. 7.

It should be noted that the male forming tool 60 engages the forming clamp 66 between the bonding pads 58 and the female forming tool 66. This isolates the forces applied by the female forming tool 66 from the junction between the bonding pads and the leads 54. This relieves any unnecessary stress from the chip-lead bonds.

FIGS. 7 and 8 show the integrated circuit device 51 clamped in position and the subsequent action of the female forming tool 66 as it commences to form the leads 54 (FIG. 7) and when it has finished forming the leads (FIG. 8). As is apparent, the leads 54 are being formed with the chip in the face up position. The leads are formed into a shape such that they are brought down and extend outwardly in the same plane as the bottom surface of the chip 52. The result is a bight shape which permits the leads to be bonded to a substrate on which the integrated circuit may rest without short circuiting to the edge of the chip. It should be understood that for purposes of illustration, the size of the leads 54 has been greatly exaggerated.

It should also be noted that the excising and forming functions are combined in cooperating tool parts. This reduces the handling of the integrated circuit device and hence the probability of error due to inadvertant movement out of position.

FIG. 9 shows the final phase of the excising and forming steps. The punch 48 and male forming tool 60 have been retracted to the starting position as has the pressure pad 62. A vacuum has once again been applied to the opening 70, and the integrated circuit device 51 with its formed leads 54 is maintained on the forming clamp 64 by the vacuum applied to openings 72 and 74. The integrated circuit device 51 is now ready to be transferred and positioned on the substrate 38.

Figure 3:
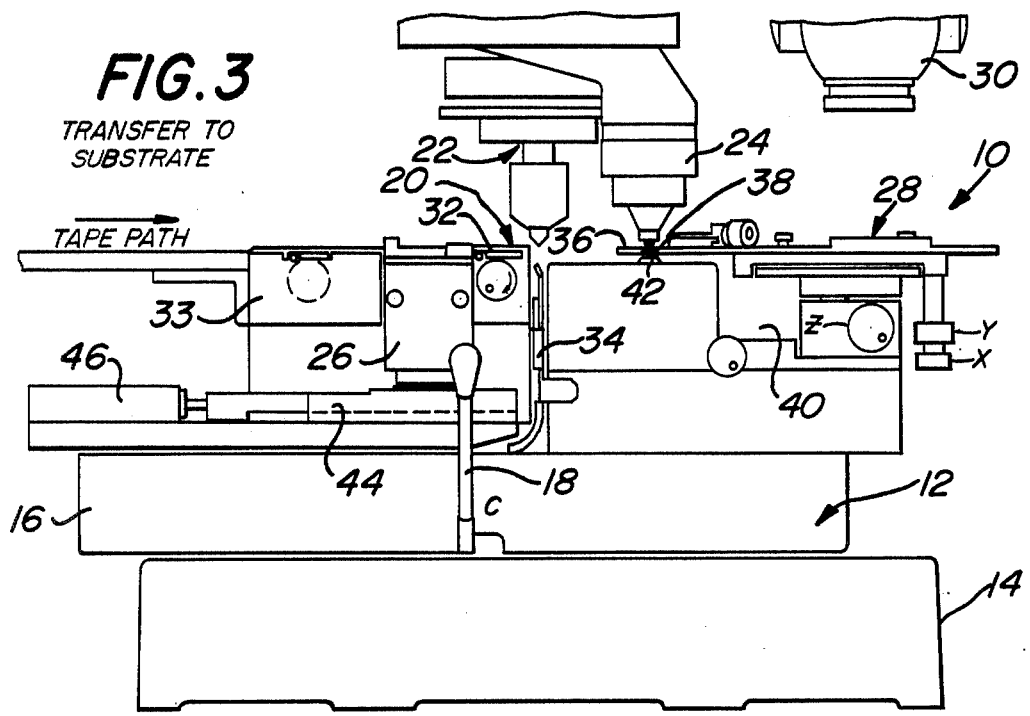
FIG. 3 is an elevational view of the assembly system in its mode for carrying the device and its leads to a substrate.

The transfer of the integrated circuit device to the substrate is effected by first moving the slide assembly 12 from position A to position C as illustrated in FIG. 3. This brings the substrate 38 into position immediately below the forming clamp 64 as illustrated in FIGS. 3 and 10. The excising, forming and transfer of the integrated circuit device 51 will not have changed its position by reason of the use of the various clamping and vacuum holding of it during each operation. Since the substrate 38 has been previously aligned, the integrated circuit device can be deposited on its surface with the leads in precise registration with the conductors previously imprinted on the substrate surface 38.

FIGS. 10, 11 and 12 show the deposit and ultimate transfer of the integrated circuit device onto the substrate 38. Referring to FIG. 10, the integrated circuit device 51 is positioned above the substrate 38. If desired, the substrate can be provided with a pressure sensitive bonding material 78. As shown, the forming and transfer assembly 24 lowers the integrated circuit device 51 onto the substrate 38 and then retracts leaving the substrate in position for bonding.

Figure 4:
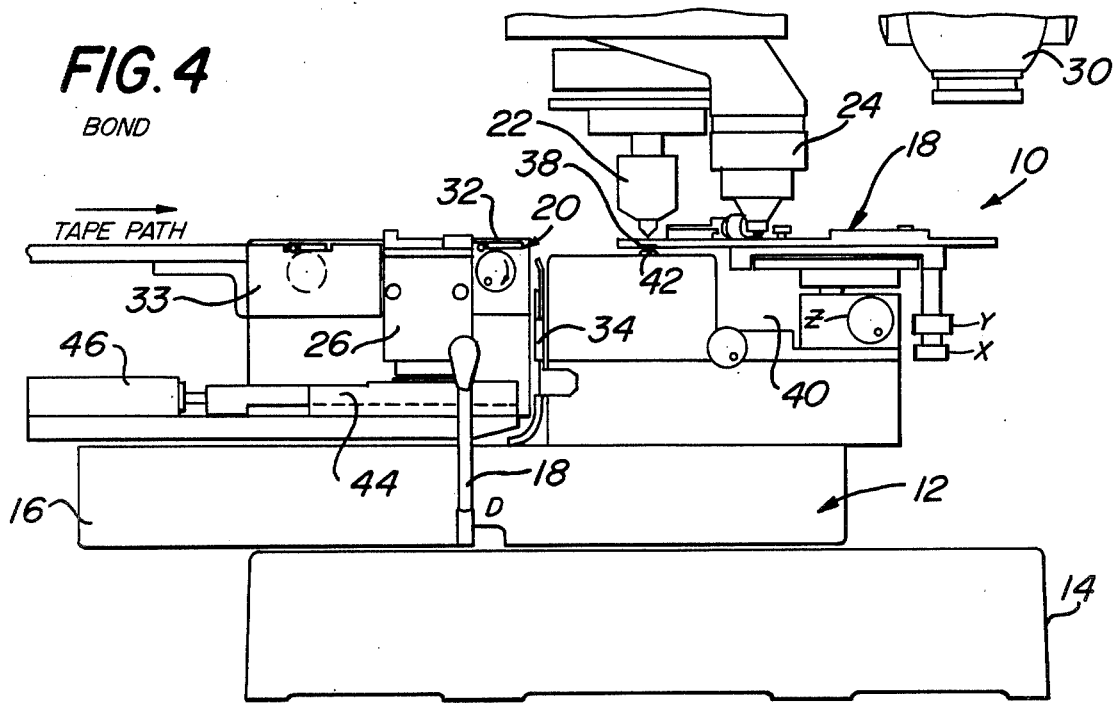
FIG. 4 is an elevational view of the assembly system in its bonding mode.

The next step in the assembly of the integrated circuit device is to bond it to the substrate. This is accomplished by moving the slide assembly 12 to position D as shown in FIG. 4. In this position, the substrate and integrated circuit device are below the bonder 22. The bonder may be equipped for either thermocompression or pulse reflow bonding. As shown in FIG. 13, the operational end of the bonder includes a thermode head 80 with appropriately shaped tips 82 and 84. The thermode head 80 also includes a heater and thermocouple assembly which are not shown. Moreover, the thermode head 80 may be either steady state or pulse heated using electronic controls. The heating and control of a thermode head is known, and therefore need not be described in detail.

In operation, either thermocompression or pulse reflow bonding in the face up position is effected by moving the previously aligned substrate into position as described above. The substrate may be heated by the anvil 42 if required. Thereafter, the bonder lowers the thermode head 80 into contact with the workpieces which in this case are the formed leads 54. The bond is effected and the bonder retracts the thermode head 80.

After the bond has been completed, the substrate and attached integrated circuit device may be returned to the alignment station (position A) of FIG. 1. At that position, the substrate may be removed or realigned for the addition of another integrated circuit or microcomponent device.

The bonding procedure illustrated by FIGS. 13, 14 and 15 is known. However, one of the purposes of the present invention is to provide a new bonding process and apparatus as illustrated in FIGS. 16, 17, 18 and 19. The process performed by the apparatus of these drawings is mechanical pulse reflow bonding. As shown, the thermode 86 includes a clamp 88 and a coaxial heated anvil 90. The anvil 90 is heated to a steady state temperature sufficient to effect a reflow bond between the leads 54 and the conductors on substrate 38. The particular anvil temperature depends upon the type of reflow bond to be effected. The clamp 88 is mounted within the anvil 90 and is cooled at the clamping tips by drawing air through the opening 92. The purpose of cooling the clamping tips 94 is to maintain them at a temperature below the melting temperature at the bond site. Although the clamp 88 may be referred to as a coaxial cold tip clamp, it should be understood that the term "cold" is a relative one suggesting a temperature at the tips 94 below bond site melting temperature and not necessarily a temperature that makes the tips 94 cold to touch.

In operation, the substrate 38 and integrated circuit device are moved into position D (FIG. 4) as described above. Thereafter, the bonder lowers the thermode 86 so that the cold tip clamp 88 engages the leads 54 at the bonding site. Thereafter, the heated anvil 90 is lowered until its tips 96 engage the conductors on the substrate 38. This now completes a heat conductive path from the anvil to the cold tip clamp. In particular, the conductive path is from the heated anvil tips 96, through the substrate conductors, through the bond site including conductors 54, into the cold tip clamp 88. The transfer of heat to the bonding site continues until a local lead flow bond is effected.

As shown in FIG. 18, the heated anvil 90 retracts but the cold tip clamp 88 remains in contact with the bonding site. This continues until the reflow bond has solidified. Thereafter, the cold tip clamp 88 is retracted and the substrate is returned to the alignment station (position A) for removal or realignment as described above.

The advantage of the process described above is that it mechanically effects a pulse reflow bond. In particular, by controlling the amount of time that the anvil is in contact with the conductors on the substrate, it is possible to control the temperature profile at the bonding site. This method of controlling the temperature profile (temperature v. time) requires much less complicated equipment than electronic controls. Moreover, it permits the cold tip clamp to hold the leads and substrate conductors in the bonding position until the bond has solidified, thus avoiding premature separation of the parts.

Control of the movement of the various elements of the assemblies 22, 24 and 26 can be effected using hydraulic or pneumatic controls with appropriate mechanical and electrical interconnections.

The assembly of microcomponent devices does not always require forming leads or the like. For example, no forming is required when bonding integrated circuit devices to a substrate in the face down position. The apparatus 10 is capable of handling this mode of bonding with the only change being a differently shaped end to the forming clamp.

FIGS. 20, 21 and 22 show the forming and transfer assembly 24 and excising assembly 26. Excising assembly 26 is the same as that shown in FIGS. 5-9. Forming and transfer assembly 24 is the same as that shown in FIGS. 5-9 except the forming clamp 64 has been replaced by the forming clamp 64' which is now provided with a recess 98 to accomodate the integrated circuit device 100 which is mounted on the film strip 102 in the face down position.

In operation, the film strip 102 is indexed into position and clamped by the pressure pad 62 as illustrated in FIG. 20. Next, the integrated circuit 100 is excised by the punch 48 and carried up to the forming clamp by the male forming tool 60 as shown in FIG. 21. A vacuum is applied to opening 70 to retain the integrated circuit device 100 in position during the punch and carrying operation. A vacuum is continuously applied to opening 72 so that when the male forming tool brings the integrated circuit device 100 into the recess 98, and the vacuum is relieved from opening 70, the integrated circuit device will have been transferred to the forming clamp 64'. Thereafter, the punch 48 and male forming tool 60 are retracted as is the pressure pad 62. The excising assembly 26 is therefore ready to receive the next integrated circuit device as shown in FIG. 22.

The next step in the assembly operation is to move the substrate into the transfer position by moving the slide assembly 12 to position C. As before, the substrate 38 will have been previously aligned. The integrated circuit 100, with excised but not formed leads, is deposited on the substrate 38 by lowering the forming clamp 64' and relieving the vacuum in opening 74. The transfer of the integrated circuit device 100 to the substrate is completed by retracting the forming clamp 64' as shown in FIG. 25.

FIGS. 26, 27 and 28 show the thermode 80 bonding the integrated circuit device 100 to the substrate 38. The previously aligned substrate 38 is moved into position by bringing the slide assembly to position D, FIG. 4. The bonder lowers the thermode 80 (FIG. 27) to effect the bond and then retracts it as shown in FIG. 28. Thereafter, the substrate is returned to the alignment station (position A) and removed or realigned for application of a subsequent microcomponent.

FIGS. 29, 30, 31 and 32 show the operation of the mechanical pulse reflow thermode for bonding the integrated circuit device 100 to the substrate in a face down position. The substrate is moved into bond position D (FIG. 4) above the previously aligned substrate. The thermode 86 lowers with the cold tip clamp 88 first engaging the integrated circuit leads. The heated anvil 90 next contacts the conductors on the substrate, and heat is transferred through the heat path to the bond site. A local reflow bond is effected. Thereafter, the heated anvil retracts leaving the cold tip clamp in position until the bond has solidified. Finally, the cold tip clamp retracts and the substrate with the bonded integrated circuit device can be moved to the alignment station for removal or realignment as above.

It should be indicated that it is also within the capabilities of the assembly apparatus 10 to excise a face up integrated circuit device without subsequently forming its leads. In that case, a forming clamp with a planar surface could be used. The excised integrated circuit device would be excised and carried to the forming clamp and then transferred to the substrate in accordance with what is described above.

In the procedures thus far described, the integrated circuit device has been transferred onto a substrate which may be heated. There are, however, a number of devices, including integrated circuit devices, which cannot withstand prolonged exposure to elevated temperatures. The deposit of the device onto a heated substrate for subsequent transfer for the bonding position is therefore prohibited. The microcomponent assembly apparatus 10 can, however, provide an alternative method for transferring the device to the substrate at the bonding position D without exposing it to heat until the bond is to be made. This is accomplished in the following manner.

The integrated circuit device 200 is excised and formed as illustrated in FIGS. 5-8. However, no vacuum is applied to the openings 72 and 74. Rather, a vacuum is maintained in the opening 70 as illustrated in FIG. 33 where the forming and transfer assembly and excising assembly are shown in their fully retracted positions. The integrated circuit device 200 is retained on the male forming tool 60 and punch 48.

The next step in the procedure is to move the slide assembly 12 to position D (FIG. 2) where the bonder 22 is above the excising assembly 26. This is more particularly shown in FIG. 34. In this case, the thermode comprises a heated anvil 90' and a cold tip clamp 88' which function in the same manner as the anvil 90 and cold tip clamp 88 of FIGS. 16-19, except the tips are modified as shown. Moreover, a vacuum is applied to opening 104 as indicated by the arrow. The vacuum serves to both cool the tip of clamp 88' and serve a holding function.

As shown in FIGS. 35 and 36, the entire thermode 86' is lowered until the cold tip clamp 88' engages the integrated circuit device 200. Thereafter, as shown in FIG. 36, it is retracted. The tip of clamp 88 is shaped to properly engage the integrated circuit device 200.

During the transfer process, the vacuum applied to opening 70 is relieved as illustrated by the absence of an arrow in FIGS. 35 and 36.

The next step in the transfer procedure is to move the slide assembly from position B to position D (FIG. 4). This brings the substrate 38 into position below the thermode 86'. The integrated circuit device 200 can then be bonded to the substrate by means of a mechanical pulse reflow bond as illustrated in FIGS. 37, 38, 39 and 40. In particular, the thermode 86' lowers the integrated circuit 200 to the previously aligned substrate 38. A bonding material 78 can be provided if desired. The cold tip clamp 88' clamps the integrated circuit device in position as shown in FIG. 38. Thereafter, the heated anvil 90' is lowered and engages the leads of the integrated circuit device thereby creating a conductive path through the bonding site and effecting a bond. Thereafter, the heated anvil 90' retracts while the cold tip clamp 88' with its shaped end holds the leads in position until the bond solidifies. Then, as shown in FIG. 40, the entire thermode 86' is retracted. The substrate 38 then can be moved to the alignment station (position A) for removal or realignment.

In some cases, the leads fan out from the chip as illustrated in FIG. 41. This presents no particular problem if the leads can be shaped along the length marked X. If, however, the lead 210 must be shaped closer in to the die 212, special problems are presented. Bending the lead along the length marked Y will result in its distal end, where the bond is to be made, being displaced laterally and it therefore may not properly register with the conductors on the substrate. To compensate for this, it is necessary to provide an extra bend in the lead 210. For this purpose, the forming and transfer assembly is modified as shown in FIG. 42. In particular, the forming and transfer assembly 24' of FIG. 42 includes a forming clamp 64" mounted reciprocably and coaxially with the female forming tool 66'. The female forming tool 66' is reciprocably and coaxially mounted within the housing 110'. Spring 68' applies a force to the forming clamp 64" and spring 69' applies a shaping force to the female forming tool 66'.

In operation, the forming clamp leads the housing 110' which in turn leads the female forming tool 66'. Accordingly, the male forming tool 60 and forming clamp 64" first engage the leads 210 to thereby clamp the same. Thereafter, the foot 112' of housing 110 descends towards punch 48 and engages the leads 210 without clamping the leads against the surface of punch 48. The female forming tool 66' engages the leads and effects a forming action. Finally, the foot 112' descends towards punch 48 in engagement with leads 210 and clamps the leads against the surface of punch 48. This permits forming of the leads within the Y length without lateral shift of the same.

The assembly apparatus 10, as described herein, is capable of operating in either a manual or semi-automatic mode. Bonding rates would approximate 50 to 175 integrated circuits per hour, depending upon the process used. At those rates, it operates with a high degree of precision and accuracy. For example, variations in the distance from the punch to the tape sprocket holes are ±0.002". Variations in the formed integrated circuit to the substrate are ±0.004". This latter figure is the total accumulated error less the substrate alignment error.

The present invention may be embodied in other specific forms without departing from the spirit or essential attributes thereof and, accordingly, reference should be made to the appended claims, rather than to the foregoing specification as indicating the scope of the invention.

We claim:

1. Apparatus for use in the assembly of microcomponent devices, comprising:
   on a unitary machine frame, the following work tools,
   (1) excising means for removing a tape mounted microcomponent device and its electrical leads from the tape;
   (2) forming means for forming the electrical leads to a predetermined shape suitable for use in further assembly;
   (3) transfer means for transferring the device and its formed leads to a pre-positioned substrate mounted on a support; and
   (4) bonding means for bonding the formed leads to lead elements on the substrate;
   whereby precise spatial relationships between the device, its leads and the work tools are maintained without adjustment for each assembly operation using the foregoing work tools.

2. Apparatus in accordance with claim 1 wherein said excising means includes carrying means for carrying the excised device and its leads to a lead forming position.

3. Apparatus in accordance with claim 1 wherein said excising means and forming means include clamping means for holding the leads in position while the leads are being formed, said forming means including a lead forming tool, said clamping means holding the leads intermediate said device and the forming tool so that the bonds which join the device and its leads are relatively free of the forces applied by the forming tool.

4. Apparatus in accordance with claim 3 wherein said clamping means includes a first jaw which is incorporated with said excising means and a second opposed jaw which is part of said forming means.

5. Apparatus in accordance with claim 3 wherein said forming tool includes co-operating male and female forming tools parts for shaping said leads, one of said forming tool parts being incorporated with said excising means, and the other of said forming tool parts being incorporated with said forming means.

6. Apparatus in accordance with claim 5 wherein the first jaw of the clamping means is also the forming tool part incorporated with the excising means.

7. Apparatus in accordance with claim 1 wherein said transfer means includes holding means for retaining said device and its leads on the forming means at the lead forming position and for depositing said device and its formed leads on a pre-aligned substrate which has been brought into alignment with said device and its formed leads,
a support for said substrate,
and displacement means for moving said support and forming means relative to each other to bring said substrate and said device on said forming means into alignment.

8. Apparatus in accordance with claim 7 including displacement means for moving said substrate support and said bonding means relative to each other to bring said substrate and the device deposited thereon by the transfer means into operational alignment for bonding the formed leads to conductors on said substrate.

9. Apparatus in accordance with claim 1 wherein said bonding means comprises:
a reciprocable bonding clamp for applying a clamping force at the site where said leads and said substrate lead elements are to be bonded together,
a reciprocable heated body for applying heat to said site,
said heated body being at a temperature above the temperature of said bonding clamp whereby heat flows from said heated body through the bonding site and into said clamp.
and means for reciprocating said heated body into and out of contact with a heat conductive path to said site while said bonding clamp is applying the clamping force whereby said clamping force continues to be applied at said bond site after heat for accomplishing the bond has been removed.

10. Apparatus in accordance with claim 1 wherein said excising means includes a relatively reciprocable punch and die, and a reciprocable pressure pad for clamping the tape in position against said die while the device and its leads are being excised by the action of said punch moving through said die.

11. Apparatus in accordance with claim 1 including means for positioning said excising means and said forming means in opposed co-operating relation to each other,
said excising means including a co-axially mounted punch, die and one of co-operating male and female tool parts of a forming tool, said punch and die being reciprocably displaceable relative to each other for excising a device and its leads from the tape, and said part of said forming tool being reciprocably displaceable relative to said punch and die for carrying an excised device and its leads to a lead forming position,
said forming means including the other of said co-operating forming tool parts and a coaxially mounted jaw for clamping the leads during forming,
said forming means being mounted in opposed coaxial relation to said excising means whereby relative movement between said forming tool part mounted with the excising means and said jaw clamps said device and its leads in position while the leads are being formed, and said forming tool part mounted with said jaw being reciprocable relative to said jaw for forming the leads in cooperation with the other of said forming tool parts.

12. Apparatus in accordance with claim 11 including holding means for retaining the device and its leads on the forming tool part as it is being carried to the lead forming position.

13. Apparatus in accordance with claim 12 wherein said holding means includes means for applying a vacuum to said forming tool part.

14. Apparatus in accordance with claim 11 wherein said excising means includes a reciprocable pressure pad co-axially mounted with said punch and die for clamping the tape in position against said die while said device and its leads are being excised by the cooperative action of said punch moving through said die.

15. Apparatus in accordance with claim 11 wherein said transfer means includes holding means for retaining the device and its formed leads on the forming means at the lead forming position and for depositing said device and its formed leads on a pre-positioned substrate which has been brought into alignment with said device and its formed leads,
a support for said substrate,
and displacement means moving said support and forming means relative to each other to bring said substrate and device with its formed leads on said forming means into alignment.

16. Apparatus in accordance with claim 15 wherein said holding means includes means for applying a vacuum through said clamp.

17. Apparatus in accordance with claim 11 wherein said clamp and said forming tool part mounted with said excising means are positioned to clamp the leads intermediate said device and the forming tool parts mounted with the forming means so that the bonds which join the device and its leads are relatively free of forces applied by the forming tool.

18. Apparatus in accordance with claim 11 wherein said bonding means comprises:
a reciprocable bonding clamp for applying a clamping force at the site where said leads and said substrate condutors are to be bonded together,
a reciprocable heated body for applying heat at the bonding site, said heated body being mounted outboard of said bonding clamp and means for maintaining said heated body at a temperature above the temperature of said bonding clamp whereby heat flows from said heated body through the bonding site into said bonding clamp when said heated body is moved into contact with a heat conductive path to said site, means for reciprocating said heated body into and out of contact with said path while said bonding clamp is applying a clamping force whereby said clamping force continues to be applied at said bond site after heat for accomplishing the bond has been removed.

19. Apparatus in accordance with claim 11 wherein said support is reciprocably mounted on said machine frame for movement of a pre-positioned substrate into alignment with said forming means and then subsequent displacement of said support to bring said substrate into alignment with said bonding means.

20. Apparatus in accordance with claim 1 wherein the forming tool includes co-operating male and female forming tool parts for shaping said lead, one of said forming tool parts being incorporated with said excising means, and the other of said forming tool parts being incorporated with said forming means.

21. Apparatus in accordance with claim 1 wherein said support is displaceably mounted on said machine frame.

said excising means being mounted on said support, means for retaining said device and its formed leads on said excising means after the leads have been formed, means for displacing said support to bring said excising means into alignment with said bonding means, means for transferring said device and its formed leads from said excising means to said bonding means, means for displacing said support to bring a prepositioned substrate on said support into alignment with said bonding means, whereby precise spatial relationships between work pieces and work tools can be maintained without adjustment for each assembly operation.

22. Apparatus for use in the assembly of microcomponent devices, comprising:

excising means for removing a tape mounted microcomponent device and its leads from the tape;

forming means for forming the leads;

means for positioning said excising means and said forming means in opposed co-operating relation to each other, said excising means including a coaxially mounted punch, die and one of co-operating male and female tool parts of a forming tool, said punch and die being reciprocably displaceable relative to each other for excising a device and its leads from the tape, and said part of said forming tool being reciprocably displaceable relative to said punch and die for carrying an excised device and its leads to a lead forming position, said forming means including the other of said co-operating forming tool parts and a coaxially mounted jaw for clamping the leads during forming, said forming tool part mounted with the excising means and said jaw being positioned to clamp said devices and its leads in position while the leads are being formed, and said forming tool part mounted with said jaw being reciprocal relative to said jaw for forming the lead in co-operation with the other of said forming tool parts.

23. Apparatus in accordance with claim 22 wherein said excising means includes a reciprocable pressure pad coaxially mounted with said punch and die for clamping the tape in position against said die while said device and its leads are being excised by the co-operative action of said punch moving through said die.

24. Apparatus for use in the assembly of microcomponent devices, comprising:

on a unitary machine frame, the following work tools, (1) excising means for removing a tape mounted microcomponent device and its electrical leads from the tape;

(2) forming means for forming the electrical leads to a predetermined shape suitable for use in further assembly;

(3) transfer means for transferring the device and its formed leads to a pre-positioned substrate mounted on a support and for depositing the device on the substrate with its leads in operational alignment with conductors on said substrate for bonding the formed leads to said conductors; and (4) bonding means for bonding the formed leads to conductors on the substrate; whereby precise spatial relations between the device, its leads, the work tools and the conductors on the substrate are maintained without adjustment for each of the excising, forming, transfer and bonding operations using the foregoing work tools.

25. Apparatus in accordance with claim 24 wherein the forming tool includes co-operating male and female forming tool parts for shaping said lead, one of said forming tool parts being incorporated with said excising means, and the other of said forming tool parts being incorporated with said forming means.

26. Apparatus in accordance with claim 25 wherein:

said excising means and said forming means are positioned in opposed co-operating relation to each other, said excising means including a co-axially mounted punch, die and one of co-operating male and female tool parts of a forming tool, said punch and die being reciprocably displaceable relative to each other for excising the device and its leads from the tape, said part of said forming tool being reciprocably displaceable relative to said punch and die for carrying an excised device and its leads to a lead forming position, and said forming tool parts being reciprocable relative to each other for forming the leads.

* * * * *